United States Patent
Tsuga et al.

(10) Patent No.: US 6,946,036 B2
(45) Date of Patent: *Sep. 20, 2005

(54) METHOD AND DEVICE FOR REMOVING PARTICLES ON SEMICONDUCTOR WAFERS

(75) Inventors: Toshihito Tsuga, Tsuchiura (JP); Minoru Fube, Yamaga-machi (JP); Kazutaka Nakayama, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 33 days.

This patent is subject to a terminal disclaimer.

(21) Appl. No.: 10/085,753

(22) Filed: Feb. 28, 2002

(65) Prior Publication Data

US 2003/0000548 A1 Jan. 2, 2003

(51) Int. Cl.[7] .................................................. B08B 3/00
(52) U.S. Cl. .......................... 134/28; 134/1.3; 134/3; 134/26; 134/30; 438/906
(58) Field of Search .............................. 134/1.3, 3, 26, 134/28, 30, 18, 902, 27; 438/906

(56) References Cited

U.S. PATENT DOCUMENTS

| | | | | |
|---|---|---|---|---|
| 5,954,885 A | * | 9/1999 | Ohmi | 134/1.3 |
| 6,039,815 A | * | 3/2000 | Yeol et al. | 134/2 |
| 6,290,777 B1 | * | 9/2001 | Imaoka et al. | 134/1 |
| 6,444,255 B2 | * | 9/2002 | Nagahara et al. | 427/108 |
| 2001/0009155 A1 | * | 7/2001 | Matsuno et al. | 134/2 |

FOREIGN PATENT DOCUMENTS

JP 2001-185520 * 6/2001

* cited by examiner

Primary Examiner—M. Kornakov
(74) Attorney, Agent, or Firm—Peter K. McLarty; W. James Brady, III; Frederick J. Telecky, Jr.

(57) ABSTRACT

The method for removing particles that adhere to the surface of semiconductor wafers is constituted so as to sequentially carry out a first cleaning process in which semiconductor wafers 100 are cleaned for a prescribed time in cleaning tank 104 containing a first cleaning solution consisting of ozone water, and, after said first cleaning process, a second cleaning process in which said semiconductor wafers 100 are cleaned for a prescribed time in cleaning tank 106 containing a second cleaning solution consisting of hydrogen water.

10 Claims, 3 Drawing Sheets

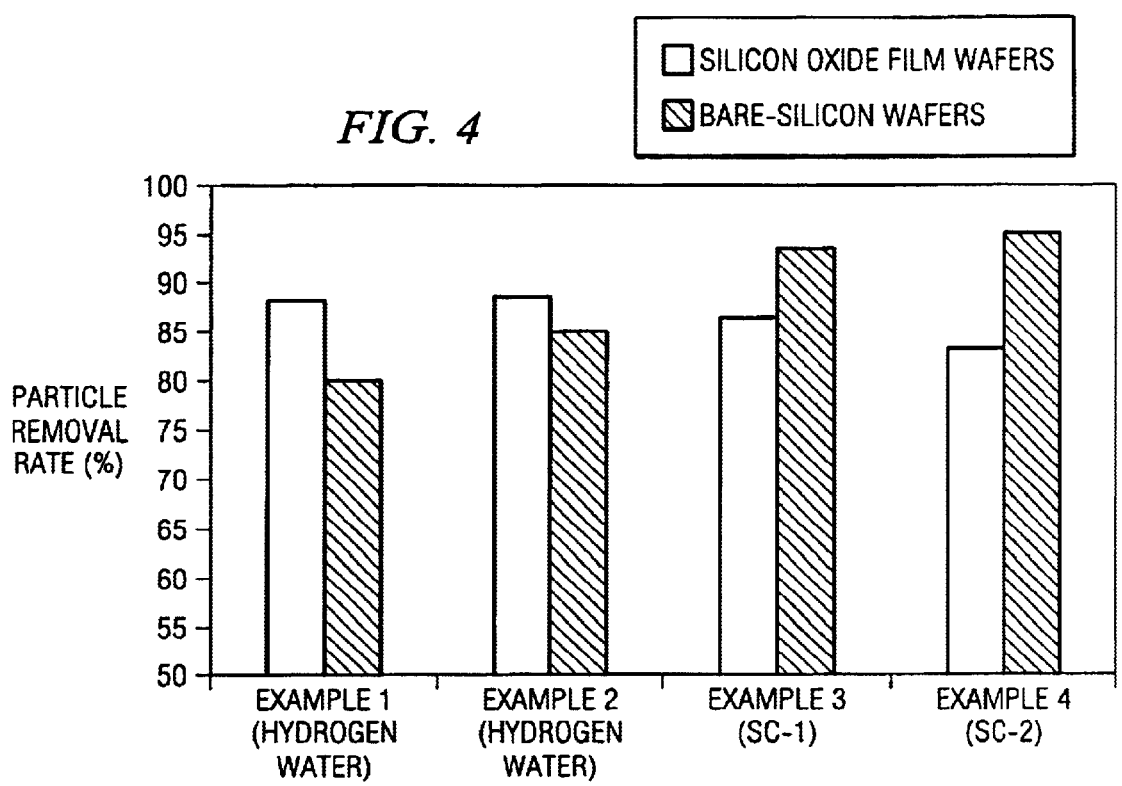
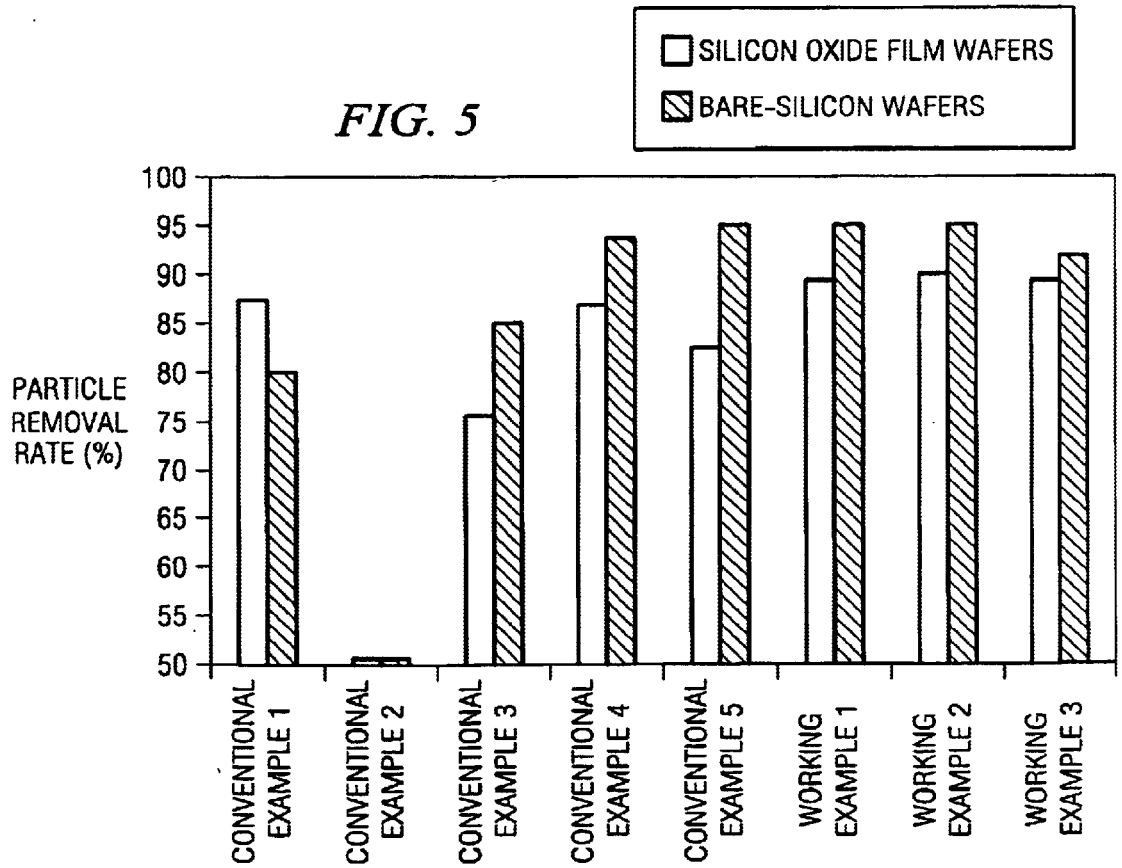

METHOD AND DEVICE FOR REMOVING PARTICLES ON SEMICONDUCTOR WAFERS

TECHNICAL FIELD TO WHICH THE INVENTION BELONGS

This invention concerns a method and device for cleaning semiconductor wafers; in particular, it concerns a method and device for removing particles that adhere to the surface of semiconductor wafers.

CROSS REFERENCES TO RELATED APPLICATIONS (None)

BACKGROUND OF THE INVENTION

Prior Art

The requirement for greater integration and higher density of semiconductor devices has brought with it ever more-stringent requirements for the degree of cleanliness against fine impurities on the surface of semiconductor wafers. Therefore in order to raise the manufacturing yield for semiconductor chips, it is necessary to remove impurities effectively by cleaning the semiconductor wafer.

The cleaning of semiconductor wafers includes multiple processes for removing from the surface of the semiconductor wafer fine particles consisting of many types of impurities, such as metal impurities, organic impurities, or silicon. In the cleaning processes, semiconductor wafers are successively cleaned in multiple cleaning tanks in which various cleaning solutions circulate. Multiple semiconductor wafers are conveyed held in an arbitrary tray and are placed within a cleaning tank for a preset cleaning time. The following describes a typical cleaning process that is carried out.

(1) The semiconductor wafers are conveyed into a cleaning tank of SC-1 (an aqueous solution of ammonia and hydrogen peroxide: $NH_4OH$, $H_2O_2$, $H_2O$) and are cleaned for about 10 minutes, mainly for the purpose of removing fine particles on the surface of the semiconductor wafers.

(2) Next, in order to rinse off the SC-1 from the surface of the semiconductor wafers, said semiconductor wafers are conveyed into a cleaning tank of ultra-pure water and are rinsed for about 10 minutes.

(3) Next, the semiconductor wafers are conveyed into a cleaning tank of SC-2 (HCl, $H_2O_2$, $H_2O$) and are cleaned for about 10 minutes, mainly for the purpose of removing metal impurities and organic impurities on the surface of the semiconductor wafers.

(4) Next, in order to rinse off the SC-2 from the surface of the semiconductor wafers, said semiconductor wafers are conveyed into a cleaning tank of ultra-pure water and are rinsed for about 10 minutes.

(5) Next, said semiconductor wafers are conveyed into a cleaning tank of a mixed solution of hydrogen fluoride (a cleaning solution of dilute HF, FPM (HF, $H_2O_2$, $H_2O$), etc.) and are cleaned for about 1–5 minutes, mainly for the purpose of removing silicon oxide film (natural oxide film) on the surface of the semiconductor wafers.

(6) As the final process, in order to rinse off the HF (hydrogen fluoride) mixed solution, said semiconductor wafers are conveyed into a cleaning tank of ultra-pure water and are rinsed for about 10 minutes.

Problems to be Solved by the Invention

But because a large quantity of chemicals are used in said typical cleaning process, it has been pointed out that the cost of consumables and the cost of treating the effluent is enormous, and curtailing these costs is strongly desired.

Against this background, research has widely been carried out into new cleaning methods employing cleaning solutions to replace these chemicals, and as one result of this research, a method has been newly proposed in which hydrogen water is used as the cleaning solution instead of the SC-1 currently used mainly for the purpose of removing fine particles on the surface of the semiconductor wafers, and ultrasonic vibration is applied to it. But although this method is able to effectively remove the fine particles (hereafter called simply "particles") that adhere to the surface of the semiconductor wafers that have a silicon oxide film layer on their surface, in cleaning silicon wafers that have no silicon oxide film layer on their surface (hereafter called "bare silicon"), this method has the problem that its particle removal efficiency is inferior to that of the current cleaning with SC-1.

The graph shown in FIG. 4 presents the results of experiments comparing the particle removal rates of the current cleaning with SC-1 and cleaning with hydrogen water, for wafers with a silicon oxide film and bare-silicon wafers. What were compared were hydrogen with hydrogen water (in-solution hydrogen concentration: 0.6 ppm) (example 1), hydrogen water to which 1 ppm of ammonia ($NH_4OH$) is added (example 2), SC-1 heated to 40° (example 3), and SC-2 heated to 80° C. (example 4) Also, except in the case of example 4, ultrasonic vibration is applied during the cleaning.

As shown above, the result is obtained that in cleaning bare silicon, the ability to remove particles is lower than with SC-1, even if one uses hydrogen water to which ammonia has been added.

Therefore the purpose of this invention is to provide a cleaning method and device that has a high ability to remove particles in cleaning both silicon oxide film wafers and bare-silicon wafers.

Means to Solve the Problems

The method of this invention for removing particles on semiconductor wafers has a first cleaning process in which semiconductor wafers are cleaned for a prescribed time by immersing them in a first cleaning solution consisting of ultra-pure water containing a prescribed quantity of ozone in a first cleaning tank, and a second cleaning process in which said semiconductor wafers are cleaned for a prescribed time by immersing them in a second cleaning solution consisting of ultra-pure water containing a prescribed quantity of hydrogen in a second cleaning tank, and ultrasonic waves are supplied to said second cleaning solution in said second process.

If cleaning with ozone water (ultra-pure water containing a prescribed quantity of ozone) is done prior to cleaning with hydrogen water (ultra-pure water containing a prescribed quantity of hydrogen), an oxide film is formed on the surface of the semiconductor wafer in said stage of cleaning with ozone water, resulting in a condition in which particles on the wafer surface adhere to the oxide film. As has long been known, the electric potential sign of the oxide film and the particles is equal, and the bonding force between them is weaker than the bonding force of the particles to the semiconductor wafer surface before an oxide film is formed. As a result, it is thought that particles can easily detach from the semiconductor wafer surface because of the subsequent cleaning process with hydrogen water. In particular, by applying ultrasonic waves in the cleaning process with hydrogen water, a large number of cavitations occur in the cleaning tank, and particles adhering to the surface of the wafers are easily detached by the force of their physical impact.

In the method of this invention for removing particles on semiconductor wafers, it is desirable that it have, between said first cleaning process and said second cleaning process, a third cleaning process in which said semiconductor wafers are cleaned for a prescribed time by immersing them in a third cleaning solution consisting of ultra-pure water in a third cleaning tank.

Moreover, it is desirable that it have, after said second cleaning process, a fourth cleaning process in which said semiconductor wafers are cleaned for a prescribed time by immersing them in a fourth cleaning solution consisting of HF mixed solution in a fourth cleaning tank. The oxide film on the semiconductor wafers is effectively removed by this fourth cleaning process.

Also, it is desirable that it have, before said fourth cleaning process, a fifth cleaning process in which said semiconductor wafers are cleaned for a prescribed time by immersing them in a fifth cleaning solution consisting of ultra-pure water in a fifth cleaning tank.

Also, it is desirable that the in-solution concentration of the ozone in said first cleaning solution be in the range 2 ppm to 20 ppm.

Also, it is desirable that said first cleaning solution contain hydrochloric acid in an in-solution concentration in the range 1 ppm to 500 ppm.

Also, it is desirable that the in-solution concentration of the hydrogen in said second cleaning solution be in the range 0.3 ppm to 0.8 ppm. Heretofore, if hydrogen water is to be used for cleaning to remove particles, it has been considered good to have the in-solution concentration of the hydrogen be as high as possible (1.0 ppm or more), but experiments by the inventors have shown that very good results are obtained at an in-solution concentration of hydrogen in the above range in the so-called batch cleaning to which this invention applies.

Moreover, it is desirable that the cleaning time in said first and second cleaning processes be in the range 3 to 20 minutes.

The device of this invention for removing particles on semiconductor wafers has a first cleaning tank filled with a first cleaning solution consisting of ultra-pure water containing a prescribed quantity of ozone, a second cleaning tank filled with a second cleaning solution consisting of ultra-pure water containing a prescribed quantity of hydrogen, an ultrasonic wave supply means for supplying ultrasonic waves to said second cleaning solution in said second cleaning tank, and a control means that controls the conveyance so as to immerse the semiconductor wafers in said first cleaning solution in said first cleaning tank, after a prescribed time remove said semiconductor wafers from said first cleaning solution and immerse them in said second cleaning solution in said second cleaning, and after a prescribed time remove said semiconductor wafers from said second cleaning solution.

BRIEF DESCRIPTION OF THE DRAWINGS

FIG. 4 Results of experiments comparing the particle removal rates of various cleaning agents on silicon oxide film wafers and bare-silicon waters.

FIG. 5 Results of experiments according to an embodiment of the instant invention.

EXPLANATION OF THE SYMBOLS

In the figures, 100 refers to silicon wafers, 102 refers to a tray, 104 refers to an ozone water cleaning tank, 106 refers to a hydrogen water cleaning tank, 108 refers to ultrasonic wave vibrators, 200 refers to a hydrogen water supply device, 202 refers to a water path, 204 refers to a degassing cylinder, 206 refers to a gas dissolving module, 302 refers to a wafer detection sensor, 304 refers to a sequencer, 306 refers to a timer, 308 refers to a transmission circuit, 310 refers to ultrasonic vibrators, 312 refers to a conveyance drive unit, and 314 refers to a conveyance crane.

DETAILED DESCRIPTION OF THE PREFERRED EMBODIMENTS

Figure 1:
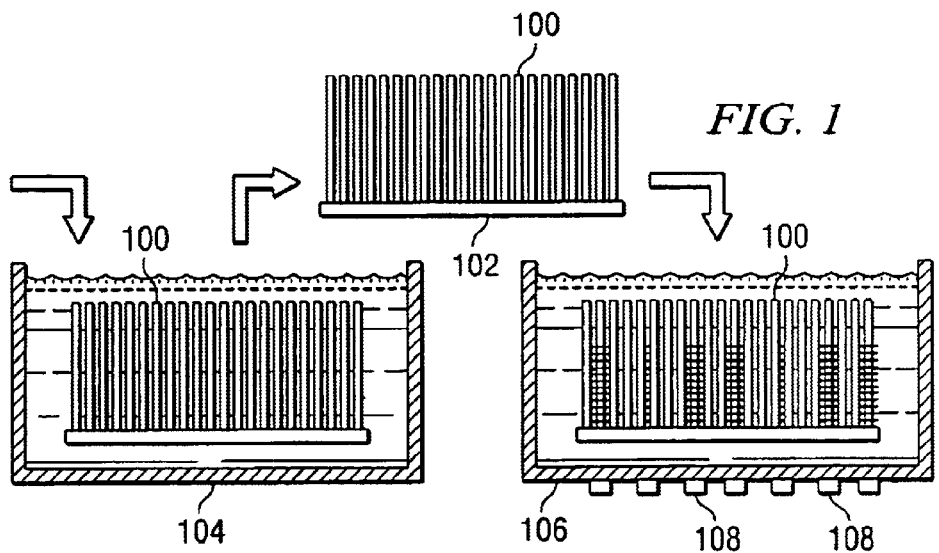
FIG. 1 This is a diagram that shows conceptually the process of this invention for the cleaning processes for removing particles.

In the following, a detailed description of this invention is given, based on an embodiment illustrated in the drawings. The method of this invention for removing particles on semiconductor wafers applies in particular to the cleaning of bare-silicon wafers, and is preferably used to replace the cleaning process for removing particles by SC-1 in the aforementioned typical cleaning process for bare-silicon wafers. FIG. 1 is a conceptual diagram of the process of this invention for the cleaning processes that removes particles.

Multiple silicon wafers 100 are held upright in an arbitrary tray 102, and a conveyance crane not pictured here conveys them between the cleaning tanks where the cleaning processes are carried out. In carrying out the particle removal processes of this invention, cleaning tank 104, which contains ozone water, and cleaning tank 106, which contains hydrogen water, are provided. The silicon wafers 100 in said tray 102 are first introduced into cleaning tank 104 containing ozone water and undergo cleaning here for 3–20 minutes, preferably 10 minutes, then are introduced into cleaning tank 106 containing hydrogen water and undergo cleaning here for 3–20 minutes, preferably 10 minutes.

Put into cleaning tank 104 is ozone water, that is, ultra-pure water (UPW) to which a prescribed quantity of ozone gas has been added. In the preferred embodiment, the in-solution of the ozone gas is 2 ppm to 20 ppm. At least while silicon wafers 100 are in the cleaning tank, ozone water is continuously supplied in cleaning tank 104 by a supply means not pictured. Silicon wafers 100 are introduced into said cleaning tank 104 by a conveyance crane not pictured, and are kept here for a prescribed time. In this process of this invention for particle removal, the surface of each silicon wafer 100 is exposed to ozone water, and a silicon oxide film (SiO2) is thereby formed on its surface. The thickness of the oxide film if cleaning with ozone water is done for 10 minutes is 8–12 Angstrom units. About 1 ppm to 500 ppm of hydrochloric acid may be added to said ozone water in order to promote the metal impurities removal efficiency.

Put into cleaning tank 106 is hydrogen water, that is, ultra-pure water (UPW) to which a prescribed quantity of hydrogen gas has been added. In the preferred embodiment, the in-solution concentration of hydrogen gas is 0.3 ppm to 0.8 ppm. This corresponds to 20% to 50% of the saturated concentration of hydrogen gas. At least while silicon wafers 100 are in the cleaning tank, hydrogen water is continuously supplied in cleaning tank 106 by a supply means not pictured. Cleaning tank 106 is equipped with ultrasonic vibrators 108, which supply—that is, radiate—ultrasonic waves of a prescribed frequency to the hydrogen water in cleaning tank 106. The irradiation with ultrasonic waves may begin either before or after the silicon wafers are conveyed into cleaning tank 106. Silicon wafers 100, after going through the process of cleaning by said ozone water, are introduced into this hydrogen water cleaning tank 106 and are kept there for a prescribed time. In this cleaning process, particles adhering to the surface of silicon wafers 100 are effectively removed.

Also, between the cleaning with ozone water and the cleaning with hydrogen water, one may clean the silicon wafers 100 with ultra-pure water and rinse away the cleaning solution that came to adhere to the silicon wafers in the ozone water cleaning. In particular, it is desirable to do this if hydrochloric acid is added to the ozone water.

Figure 2:
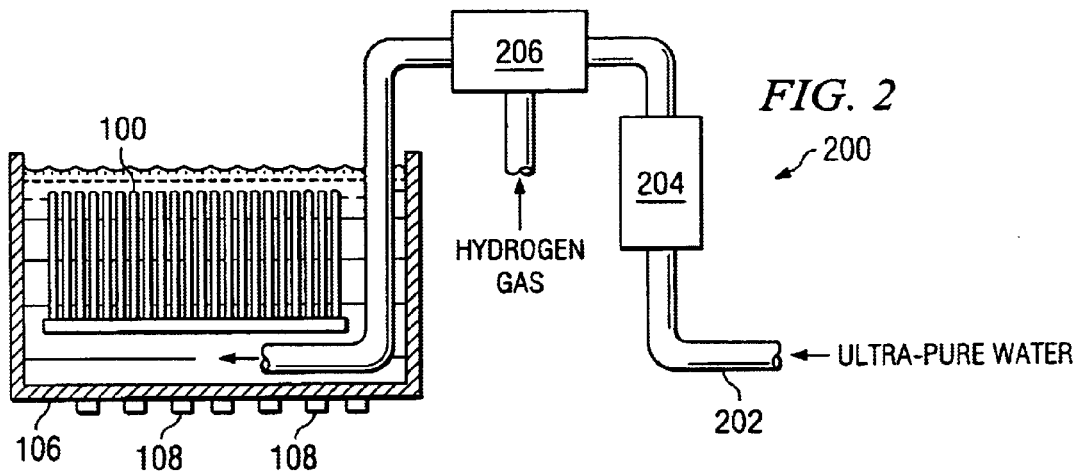
FIG. 2 This is a diagram that outlines the composition of a hydrogen water supply device.

FIG. 2 outlines the composition of a hydrogen water supply device that generates hydrogen water and supplies it to cleaning tank 106. In the drawing, hydrogen water supply device 200 is constructed with degassing cylinder 204 and gas dissolving module 206 positioned on top of water path 202, which supplies ultra-pure water to cleaning tank 106. Degassing cylinder 204 is used for removing the nitrogen, oxygen, and other in-solution gas that is contained in the ultra-pure water. Gas dissolving module 206, which is composed using a hollow-thread film module, etc., is for dissolving a prescribed quantity of hydrogen gas into the ultra-pure water that passes through it, so one generates hydrogen water of the prescribed concentration by introducing flow-controlled hydrogen gas into it and passing ultra-pure water through its gas atmosphere. In the embodiment of this invention, the desirable in-solution hydrogen concentration of the hydrogen water supplied to cleaning tank 106 is 0.3 ppm to 0.8 ppm, that is, 20% to 50% of its saturated concentration. The device that supplies ozone water to cleaning tank 104 may be constituted by an ozone water supply device of the same composition as above (that is, it supplies ozone gas instead of hydrogen gas to the gas dissolving module). It may also be constituted with degassing cylinder 204 removed.

Figure 3:
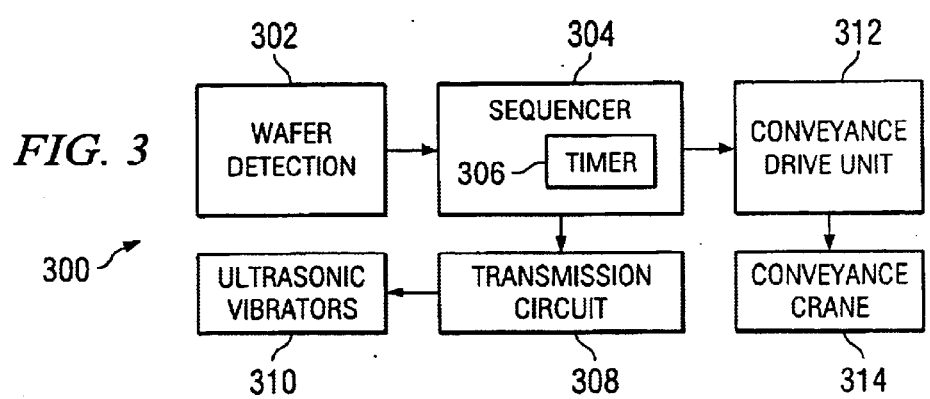
FIG. 3 This is a control block diagram for implementing the cleaning processes of this invention.

FIG. 3 is a control block diagram for implementing the cleaning processes of this invention. In control 300, ultrasonic vibrators 310 and silicon wafer conveyance crane 314 are driven and controlled based on control signals from sequencer 304. Sequencer 304 is equipped with timer 306, and it is activated (set) or stopped (reset) by receiving detection signals from wafer detection sensor 302. Wafer detection sensor 302 is installed on or in cleaning tanks 104 and 106 in FIG. 1 and detects whether silicon wafers 100 are present inside the cleaning tank. Sequencer 304 monitors the time measured by timer 306 and is constituted so as to output each prescribed control signal when it reaches a preset time. The prescribed control signal from sequencer 304 is given to transmission circuit 308, which excites ultrasonic vibrators 310, and ultrasonic waves are supplied inside the cleaning tank. Also, sequencer 304 emits the prescribed control signal to conveyance drive unit 312, whereby conveyance crane 314 is activated and silicon wafers 100 are conveyed out of cleaning tank 104 or 106.

Control by said control block is begun by wafer detection sensor 302 detecting the conveyance of silicon wafers 100 into cleaning tank 104. That is, when silicon wafers 100 are conveyed into cleaning tank 104 by conveyance crane 314, wafer detection sensor 302 detects this and emits a detection signal to sequencer 304. When sequencer 304 inputs this detection signal, timer 306 is set, and measurement of the time begins. Sequencer 304 monitors the time measured by timer 306 and maintains a wait state, without emitting any control signal, until the preset cleaning time (for example, 10 minutes) elapses. By this process, the surface of the silicon wafers 100 is oxidized, and a silicon oxide film is formed on their surface. The formation of the silicon oxide film on the surface of the silicon wafers creates a state in which the particles that had adhered to said surface adhere to the silicon oxide film.

When timer 306 measures the set cleaning time and sequencer 304 detects it, sequencer 304 outputs a control signal to move silicon wafers 100 from cleaning tank 104 to the next cleaning tank 106. Conveyance drive unit 312, upon receiving this, activates conveyance crane 314 and conveys silicon wafers 100 out of ozone water cleaning tank 104 and into hydrogen water cleaning tank 106. If, by activation of conveyance crane 314, silicon wafers 100 are properly conveyed out of cleaning tank 104, its wafer detection sensor 302 detects this, notifies sequencer 304, and resets timer 306. Next, when silicon wafers 100 are conveyed into hydrogen water cleaning tank 106, its wafer detection sensor 302 detects this and emits a detection signal to sequencer 304. When sequencer 304 inputs this detection signal, timer 306 is set once again, and maintains a wait state, without emitting any control signals, until the preset cleaning time (for example, 10 minutes) elapses. And in parallel with the setting of said timer, sequencer 304 outputs a signal to transmission circuit 308 to begin supplying ultrasonic waves. Upon receiving this, transmission circuit 308 excites ultrasonic vibrators 310, which are installed on cleaning tank 106. There upon, ultrasonic waves are supplied into cleaning tank 106, promoting the removal of particles on the surface of silicon wafers 100 by the physical impact force due to the cavitation effect.

When sequencer 304 detects that the preset cleaning time has elapsed, it outputs to transmission circuit 308 a signal to terminate the supply of ultrasonic waves. Upon receiving this, transmission circuit 308 terminates the excitation by ultrasonic vibrators 310. In parallel with this, sequencer 304 outputs to conveyance drive unit 312 a control signal to convey silicon wafers 100 out of cleaning tank 106, and thereby conveyance crane 314 is activated and silicon wafers 100 are conveyed out of cleaning tank 106. If, by activation of conveyance crane 314, silicon wafers 100 are properly conveyed out of cleaning tank 106, wafer detection sensor 302 detects this and resets timer 306, resulting in a wait state for the next silicon wafers. With this, the control carried out by the series of cleaning processes comes to an end.

In the preferred embodiment of this invention, a third cleaning process with a HF mixed solution (a cleaning solution of dilute HF, FPM (HF, H2O2, H2O), etc.) is carried out. The third cleaning process, with a HF mixed solution, is carried out, following the above cleaning process with hydrogen water, for the purpose of removing the natural oxide film. The need for this process is high if high device electrical characteristics are required, such as source-drain formation, contact hole formation, or EPI film formation. If cleaning is done with a HF mixed solution, next the cleaning solution is rinsed away with ultra-pure water or hydrogen water (in this case, ultrasonic waves may be supplied). Also, it is desirable to rinse away the cleaning solution of all the ultra-pure water processes prior to this third cleaning process.

WORKING EXAMPLE 1

The inventors carried out experiments to verify the effect of this invention. In the first experiment, about 300–400 particles per 6 inches were intentionally made to adhere onto bare-silicon wafers and silicon oxide film wafers, particle removal was done by the conventional method and by the method of this invention, and the number of particles remaining in each case was measured. The compared cleaning methods are as follows.

Conventional example 1: The case in which cleaning is done by supplying ultrasonic waves to hydrogen water (in-solution concentration: 0.6 ppm)

Conventional example 2: The case in which cleaning is done with ozone water (in-solution concentration: 10 ppm), and rinsing is done with ultra-pure water Conventional example 3: The case in which cleaning is done by supplying ultrasonic waves to ozone water (in-solution concentration: 10 ppm), and rinsing is done with ultra-pure water Conventional example 4: The case in which cleaning is done by supplying ultrasonic waves to SC-1 at 40° C., and rinsing is done with ultra-pure water Conventional example 5: The case in which cleaning is done with SC-1 at 80° C., and rinsing is done with ultra-pure water Working example 1: The case in which cleaning is done with, ozone water (in-solution concentration: 10 ppm), rinsing is done with ultra-pure water, then cleaning is done by supplying ultrasonic waves to hydrogen water (in-solution concentration: 0.6 ppm)

Working example 2: The case in which cleaning is done by supplying ultrasonic waves to ozone water (in-solution concentration: 10 ppm), rinsing is done with ultra-pure water, then cleaning is done by supplying ultrasonic waves to hydrogen water (in-solution concentration: 0.6 ppm)

Working example 3: The case in which cleaning is done with ozone water (in-solution concentration: 10 ppm), cleaning is done by supplying ultrasonic waves to hydrogen water (in-solution concentration: 0.6 ppm), then cleaning is done with HF mixed solution (0.5 wt % HF, 0.5 wt % H2O2), and finally rinsing is done by supplying ultrasonic waves to hydrogen water.

Also, in each cleaning process, cleaning solution was supplied into an 18.24-liter cleaning tank at a supply quantity of 15.0 liter/mm, and the solution wafers were immersed for 10 minutes in each tank. If ultrasonic waves were used, their output was set to 1.0 MHz, 4.1 W/cm². Measurement of the residual particles was applied to those of size 0.2 urn or larger, using a laser diffusion type particle counter. The results are shown in FIG. 5.

From the above results, if cleaning is done with ozone water then cleaning is done with hydrogen water according to this invention (working examples 1–3), the removal rate for particles adhering to the surface of silicon wafers (initial number of particles—number of particles after cleaning)/ initial number of particles×100) showed a high particle removal rate in the cleaning of both bare-silicon wafers and silicon oxide film wafers, as compared with the case in which only ozone water or only hydrogen water is used (conventional examples 1–3). And in the cases according to the working examples of this invention, even with respect to cleaning using a solution with SC-1 (conventional examples 4 and 5), it showed a particle removal rate of about the same in the cleaning of bare-silicon wafers, and greater in the cleaning of silicon oxide film wafers.

WORKING EXAMPLE 2

The inventors also conducted experiments to discover the preferable range of in-solution hydrogen concentration to be used in the hydrogen water cleaning process. According to what was known previously, the in-solution hydrogen concentration of the hydrogen water to be used for cleaning was set to the range 1.0 ppm to 1.6 ppm. But from experiments by the inventors, it was learned that in the batch-type cleaning using cleaning tanks as shown in FIG. 2, particles on the surface of wafers are removed very effectively at an in-solution hydrogen concentration of 0.3 ppm to 0.8 ppm.

Figure 6:
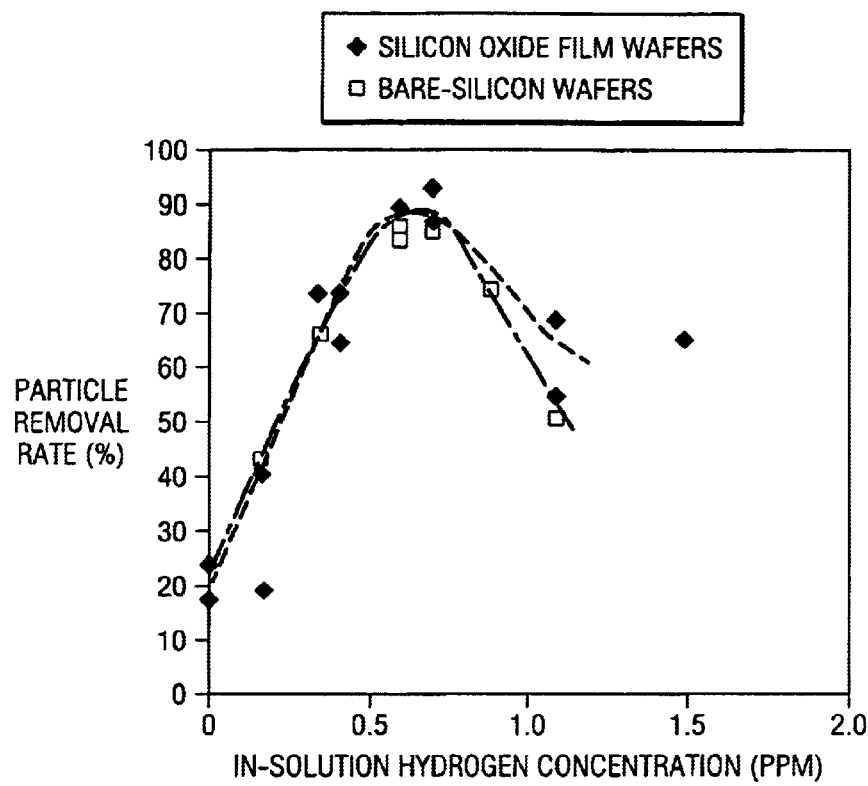
FIG. 6 Relationship between hydrogen concentration and particle removal rate (ammonia mixed into the hydrogen water).
Figure 7:
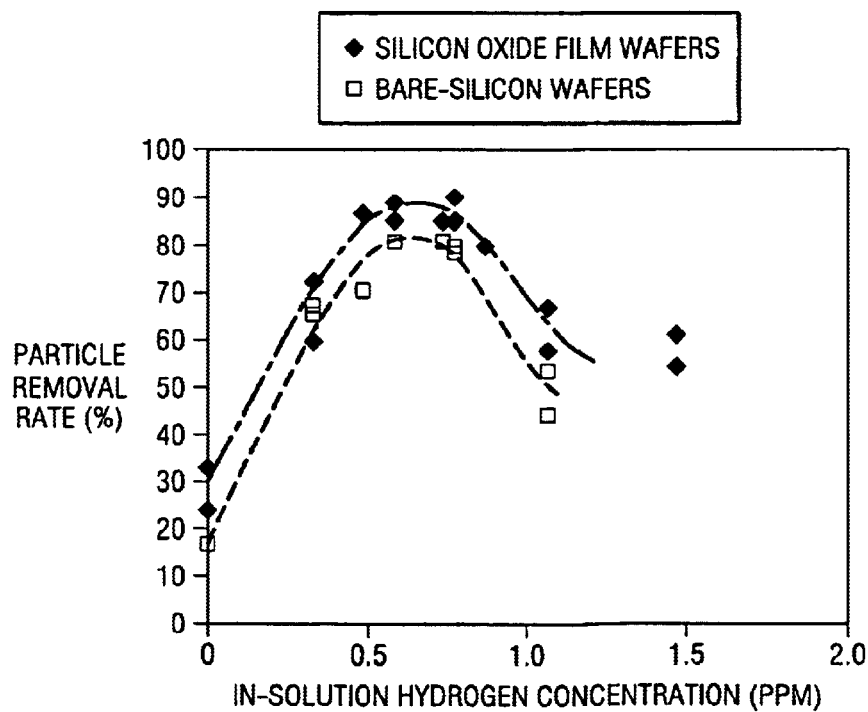
FIG. 7 Relationship between hydrogen water concentration and particle removal rate (ammonia not mixed into hydrogen water).

In the experiments, samples were made in which about 300–400 particles per 6 inches were intentionally made to adhere onto bare-silicon wafers and silicon oxide film wafers, they were cleaned using hydrogen water of varying in-solution hydrogen water concentrations, and the number of particles remaining after cleaning was measured. The in-solution hydrogen of the hydrogen water was varied between 0 and 1.5 ppm. Also, in each cleaning process, hydrogen water was supplied into an 18.24-liter cleaning tank at a supply quantity of 15.0 liter/min, and the silicon wafers were immersed for 10 minutes in each tank. The ultrasonic wave output was set to 1.0 MHz, 4.1 W/cm². Measurement of the residual particles was applied to those of size 0.2 um or larger, using a laser diffusion type particle counter. The experiments were carried out on hydrogen water into which 1 ppm (pH=9.4) ammonia was mixed (FIG. 6) and on hydrogen water into which none was mixed (FIG. 7). The results are shown in FIG. 6 and FIG. 7.

As is clear from the above results, if cleaning is done using hydrogen water having an in-solution hydrogen concentration of 1.0 ppm to 1.6 ppm, which heretofore has been considered the preferable range, a very low particle removal rate is obtained, but if the hydrogen concentration is set to a range of 0.3 ppm to 0.8 ppm, that is, 20% to 50% of its saturated concentration, a very good particle removal rate is shown. Properly speaking, the ultrasonic waves that are generated in the hydrogen water are thought to function so as to remove the particles on the surface of the silicon wafers by the physical impact force due to their cavitation effect, but if the in-solution hydrogen concentration is increased to near its saturated concentration, bubbles readily occur inside the cleaning tank, and this is thought to instead reduce the ability to remove particles. That is, it is thought that because of the increase in bubbles, some of them adhere to the silicon wafer surface by surface tension and linger there, which actually adsorbs particles in the hydrogen water, and the large number of bubbles impede the energy propagation of the ultrasonic waves and reduce the (physical) impact force due to the cavitation effect on the silicon wafer surface. Therefore, by the above experiments, control of the bubbles is possible, and it is very effective for particle removal to use hydrogen water of 0.3 ppm to 0.8 ppm, which is 20% to 50% of the saturated in-solution hydrogen concentration, as the range of concentration that effectively links the cavitation effect due to the ultrasonic waves to particle removal.

The foregoing has been a description, with diagrams, of an embodiment of this invention. But this invention is not limited to what is shown in the above embodiment, and it is clear that it can be modified or improved based on what appears in the patent claims. As shown by the above experimental results, the particle removal method of this invention can be put to effective use not only in cleaning bare-silicon wafers but also in cleaning silicon oxide film wafers.

Effects of the Invention

With this invention as described above, high particle removal is possible in cleaning using only functional water consisting of ozone water and hydrogen water, both for silicon oxide film wafers and bare-silicon wafers. In particular, even more-effective particle removal can be done in a process of cleaning with hydrogen water by setting its in-solution hydrogen concentration to 0.3 ppm to 0.8 ppm, which is 20% to 50% of its saturated in-solution hydrogen concentration.

What is claimed:

1. A method for removing particles on semiconductor wafers, wherein the semiconductor wafers are bare wafers or wafers having a silicon oxide film, comprising the steps of:

forming an oxide film at least 2.5 Angstroms thick on a surface of a semiconductor wafer while performing a first cleaning process in which semiconductor wafers are cleaned for a prescribed time by immersing them in a first cleaning solution consisting of ultra-pure water containing a prescribed quantity of ozone in a first cleaning tank, wherein the prescribed time in the first cleaning process is in the range of 3 to 20 minutes; and performing a second cleaning process in which said semiconductor wafers are cleaned for a prescribed time by immersing them in a second cleaning solution consisting of ultra-pure water containing 0.3 ppm to 0.4 ppm of hydrogen in a second cleaning tank, wherein ultrasonic waves are supplied to said second cleaning solution in said second process.

2. A method for removing particles on semiconductor wafers as described in claim 1, further comprising the step of, between said first cleaning process and said second cleaning process, performing a third cleaning process in which said semiconductor wafers are cleaned for a prescribed time by immersing them in a third cleaning solution consisting of ultra-pure water in a third cleaning tank.

3. A method for removing particles on semiconductor wafers as described in claim 1, further comprising the step of, after said second cleaning process, performing a fourth cleaning process in which said semiconductor wafers are cleaned for a prescribed time by immersing them in a fourth cleaning solution consisting of HF mixed solution in a fourth cleaning tank.

4. A method for removing particles on semiconductor wafers as described in claim 1, wherein an in-solution concentration of ozone in said first cleaning solution is in the range 2 ppm to 20 ppm.

5. A method for removing particles on semiconductor wafers as described in claim 1, wherein the prescribed time in said second cleaning process is in the range 3 to 20 minutes.

6. A method of removing particles on a semiconductor wafer wherein the semiconductor wafer is a bare wafer or a wafer having a silicon oxide film, comprising:

forming an oxide film at least 2.5 Angstroms thick on a surface of a semiconductor wafer during a first cleaning process in which the semiconductor wafer is cleaned for a prescribed time by immersing the semiconductor wafer in a first cleaning solution consisting of ultra-pure water containing a prescribed quantity of ozone in a first cleaning tank, wherein the prescribed time in the first cleaning process is in the range of 3 to 20 minutes; and performing a second cleaning process in which the semiconductor wafer is cleaned for a prescribed time by immersing the semiconductor wafer in a second cleaning solution consisting of ultra-pure water containing a prescribed quantity of hydrogen in a second cleaning tank, wherein ultrasonic waves are supplied to said second cleaning solution in said second process.

7. A method for removing particles on a semiconductor wafer as described in claim 6, further comprising, between said first cleaning process and said second cleaning process, performing a third cleaning process in which the semiconductor wafer is cleaned for a prescribed time by immersing the semiconductor wafer in a third cleaning solution consisting of ultra-pure water in a third cleaning tank.

8. A method for removing particles on semiconductor wafers as described in claim 6 further comprising, after said second cleaning process, performing a fourth cleaning process in which the semiconductor wafer is cleaned for a prescribed time by immersing the semiconductor wafer in a fourth cleaning solution consisting of an HF mixed solution in a fourth cleaning tank.

9. A method for removing particles on semiconductor wafers as described in claim 6, wherein an in-solution concentration of ozone in said first cleaning solution is in the range 2 ppm to 20 ppm.

10. A method for removing particles on a semiconductor wafer as described in claim 6, wherein the prescribed time in said second cleaning process is in the range 3 to 20 minutes.

* * * * *